United States Patent
Smith et al.

(10) Patent No.: US 8,274,336 B1
(45) Date of Patent: Sep. 25, 2012

(54) SATURATED POWER AMPLIFIER SYSTEM

(75) Inventors: Malcolm Smith, San Jose, CA (US);
Chu Shiung Ho, Milpitas, CA (US);
Caesar See-Hoi Wang, Fremont, CA (US); Baker Scott, San Jose, CA (US)

(73) Assignee: Amalfi Semiconductor, Inc., Los Gatos, CA (US)

( * ) Notice: Subject to any disclaimer, the term of this patent is extended or adjusted under 35 U.S.C. 154(b) by 105 days.

(21) Appl. No.: 12/893,201

(22) Filed: Sep. 29, 2010

Related U.S. Application Data

(60) Provisional application No. 61/246,744, filed on Sep. 29, 2009, provisional application No. 61/246,672, filed on Sep. 29, 2009, provisional application No. 61/246,680, filed on Sep. 29, 2009, provisional application No. 61/246,740, filed on Sep. 29, 2009, provisional application No. 61/246,762, filed on Sep. 29, 2009.

(51) Int. Cl.
*H03F 3/04* (2006.01)
*H03G 3/20* (2006.01)

(52) U.S. Cl. .................................. 330/311; 330/136
(58) Field of Classification Search ............... 330/311, 330/136
See application file for complete search history.

(56) References Cited

U.S. PATENT DOCUMENTS

| | | | |
|---|---|---|---|
| 5,861,777 A * | 1/1999 | Sigmon et al. | 330/136 |
| 7,355,479 B2 * | 4/2008 | Van Der Heijden | 330/292 |
| 7,859,338 B2 * | 12/2010 | Bajdechi et al. | 330/253 |
| 2009/0160548 A1 * | 6/2009 | Ishikawa et al. | 330/127 |

* cited by examiner

*Primary Examiner* — Robert Pascal
*Assistant Examiner* — Khiem Nguyen
(74) *Attorney, Agent, or Firm* — Paul Davis; Goodwin Procter LLP

(57) ABSTRACT

A saturated power amplifier system has a saturated power amplifier that receives an input signal. The saturated power amplifier has one or more stages, including one or more output stages. Each output stage produces multiple signals which are combined. Each output stage has one or more levels of cascoding including one or more thick oxide devices and one or more thin oxide devices.

44 Claims, 5 Drawing Sheets

SATURATED POWER AMPLIFIER SYSTEM

CROSS-REFERENCE TO RELATED APPLICATIONS

This application claims the benefit of U.S. Ser. No. 61/246,744 filed Sep. 29, 2009 and is related to U.S. Ser. No. 61/246,672, U.S. Ser. No. 61/246,680, U.S. Ser. No. 61/246,740, and U.S. Ser. No. 61/246,762, all filed on Sep. 29, 2009. All of the above-identified applications are fully incorporated herein by reference.

BACKGROUND

1. Field of the Invention

This invention relates generally to power amplifiers, and more particularly to saturated power amplifier systems.

2. Description of the Related Art

Electronic amplifiers receive an input signal and provide an output signal that is typically a larger magnitude version of the input signal. As is well-known, class A, class AB, class B, or class C amplifiers are broad general categories of electronic amplifiers (there are also switching-mode amplifiers, such as class D, class E, class F2 and the like. The class A and AB amplifiers operate in a linear manner, while the class B and C amplifiers operate in a non-linear manner. The class A, AB, B, and C designations are generally determined by the position of the quiescent current point (Q-point) on the amplifier's load line, as set by a particular amplifier bias setting.

The Q-point position is set by bias levels (e.g., voltages) applied to the electronic amplifier circuit components. These amplifier classifications apply to small signal inputs to wideband (untuned) amplifiers.

A tuned amplifier is an electronic amplifier that is configured to provide a maximum gain at a particular input signal frequency. For example, a tuned RF amplifier provides a maximum gain at a particular RF operating frequency or at a frequency within a particular RF operating frequency band (e.g., a cellular telephony (wireless) frequency band designated for operation by a government agency). The amplifier is tuned to provide maximum gain at the desired frequency by resonating capacitance with inductance in the amplifier circuit.

In an ideal amplifier, the output signal waveform exactly corresponds to the input signal waveform (i.e., a linear relationship), except that the output signal waveform is increased in amplitude and possibly time-delayed (phase shifted). All real world amplifiers, however, distort the input signal during amplification such that there is at least a small degree of non-linearity between the amplifier's output signal and the driving input signal. For example, distortion can occur because of the amplifier's inherent characteristics (e.g., non-linear signal response during operation) or because of extraneous signals affecting the output signal (e.g., noise).

In wireless (e.g., radio) communications systems, the signal carrying information being transmitted is typically a byproduct of a carrier signal component and a modulating signal component. The modulating signal carries the transmitted information and is used to alter (modulate) the carrier signal waveform. Various well-known modulation techniques include amplitude modulation (AM), frequency modulation (FM), pulse code modulation (PCM), Gaussian minimum shift keying (GMSK), and coded modulation schemes (e.g., coded orthogonal frequency division multiplexing (COFDM)). In wireless communication systems, both carrier signal and modulating signal distortion are important design factors. Since the modulating signal component of the signal being amplified carries the information, modulating signal distortion should be minimized.

Three types of distortion that are of interest in RF amplifiers are harmonic distortion of the input signal to the amplifier, amplitude distortion of the modulating signal component of the input signal (e.g., AM-AM envelope distortion), and phase distortion of the modulated signal due to input envelope changes (e.g., AM-PM distortion). Since amplifiers used in RF applications are typically tuned amplifiers, harmonic components of the input signal are suppressed to acceptable levels in the amplifier's output signal. But RF amplifiers must amplify the input signal such that the modulating component in the amplified output signal is acceptably linear (acceptably distortion-free). If not driven into saturation by the input signal, both class A and class AB tuned RF amplifiers typically provide the required modulating signal component linearity for modern wireless power amplification applications (e.g., amplifying cellular telephone signals for transmission by the handset).

A saturated amplifier is an amplifier (regardless of amplifier class rating) that is operated with high input signal overdrive such that the amplifier is severely voltage limited. That is, in a saturated amplifier, the output signal voltage is limited by the supply voltages applied to the amplifier (i.e., the top-rail and bottom-rail voltages). Therefore, the amplified output voltage signal waveform is clipped. Both the output voltage and current are moving through the available extremes of the amplifying component(s) (e.g., in both the ohmic/high current regions and cutoff/high voltage region). A saturated amplifier is a non-linear amplifier (i.e., the output signal waveform is a clipped version of the input signal waveform). However, when using some modulation schemes where the envelope of the input signal is constant, the amplitude-limiting characteristic of a saturated amplifier is acceptable.

Modulation methods of this type typically use phase or frequency variations to carry the modulated information signal. Low AM-PM distortion is important. Saturated amplifiers advantageously provide high DC operating power- to-RF output power efficiency with low AM-PM distortion.

Electric power available to portable wireless (e.g., radio) transceivers (e.g., cellular telephone handsets) is typically limited by battery life and desired talk-time. Of the electronic components in such transceivers, the power amplifier in the transmitter section typically consumes the most electric power. As such transceivers are increasingly miniaturized, electric power consumption becomes a critical design consideration, because long battery life is desirable. Some transceivers have transmitter sections that output signals at selectable power levels. For example, in a typical cellular telephone handset operating under the Global System for Mobile Communications (GSM), the power of the RF input signal provided to the final stage amplifier of the transmitter is high and relatively constant. The output power of the final stage amplifier is controlled with an analog control signal. The output power of the final stage amplifier is reduced as the analog control signal is reduced, but since the battery voltage and power amplifier load impedance are constant, the DC to RF power efficiency is also reduced.

It is therefore desirable to have a saturated amplifier circuit that provides selectable output power levels and exhibits, power efficiency over the desired range of power levels, high gain, high voltage swing and improved efficiency.

SUMMARY

An object of the present invention is to provide a saturated power amplifier system with high gain.

Another object of the present invention is to provide a saturated power amplifier system with high voltage swing.

Yet another object of the present invention is to provide a saturated power amplifier system with improved gain.

A further object of the present invention is to provide a saturated power amplifier system with improved efficiency.

These and other objects of the present invention are achieved in, a saturated power amplifier system with a saturated power amplifier that receives an input signal. The saturated power amplifier has one or more stages, including one or more output stages. Each output stage produces multiple signals which are combined. Each output stage has one or more levels of cascoding including one or more thick oxide devices and one or more thin oxide devices. A bias of cascode is increased when a high output voltage is detected.

DETAILED DESCRIPTION

Figure 1:
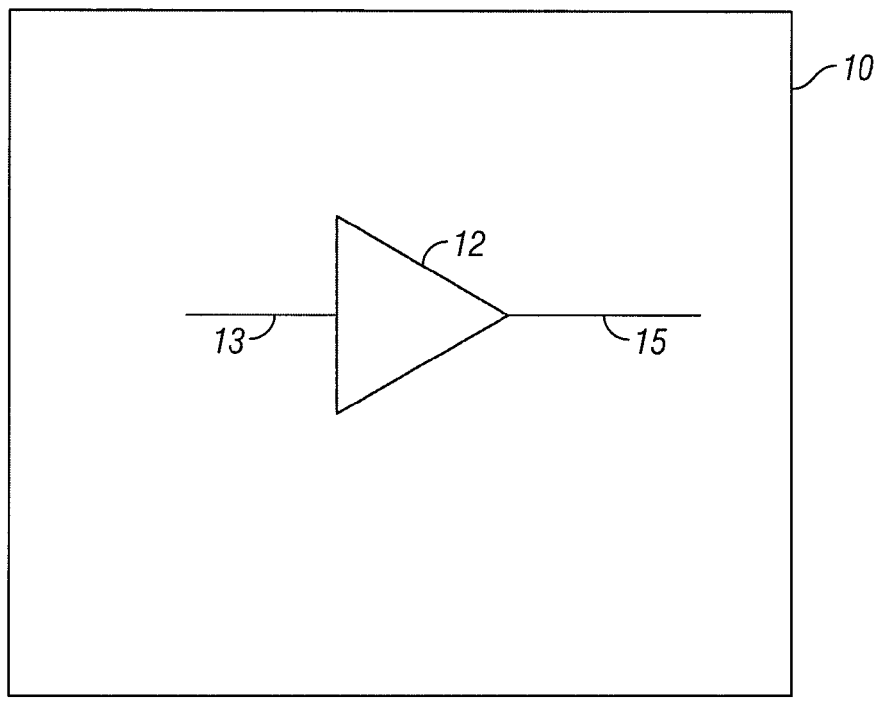
FIG. 1 illustrates one embodiment of a saturated power amplifier system of the present invention.
Figure 2:
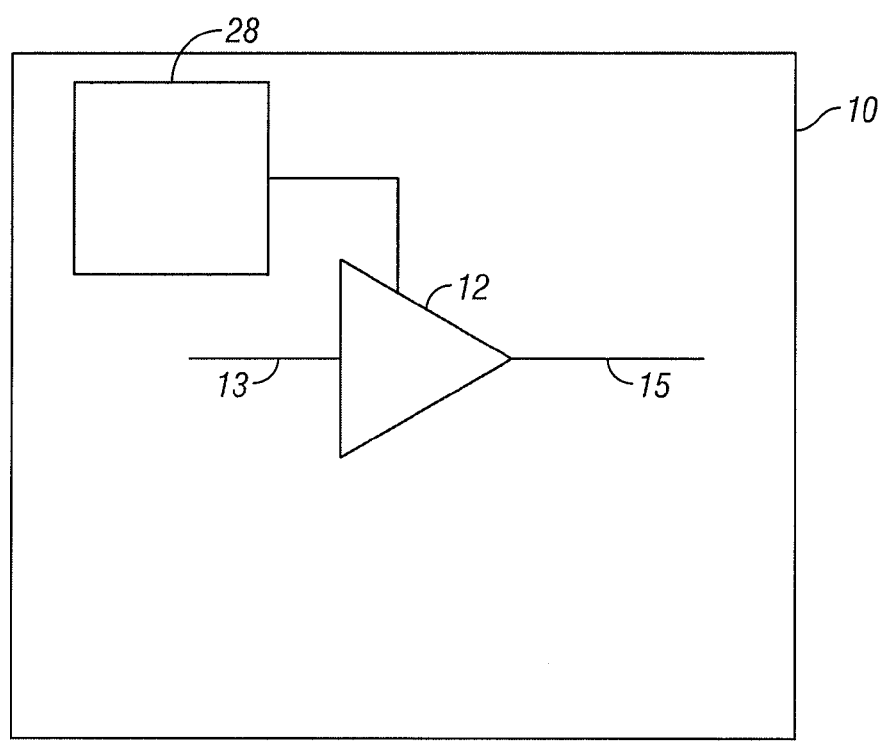
FIG. 2 illustrates an input signal that generates an output signal of the FIG. 1 embodiment.

One embodiment of the present invention is a saturated power amplifier system generally denoted as element 10 shown in FIG. 1. Referring to FIG. 2, the system 10 includes a saturated power amplifier 12 that receives an input signal 13 and generates an output signal 15. In one embodiment, the saturated power amplifier 12 can be a CMOS power amplifier.

Figure 3:
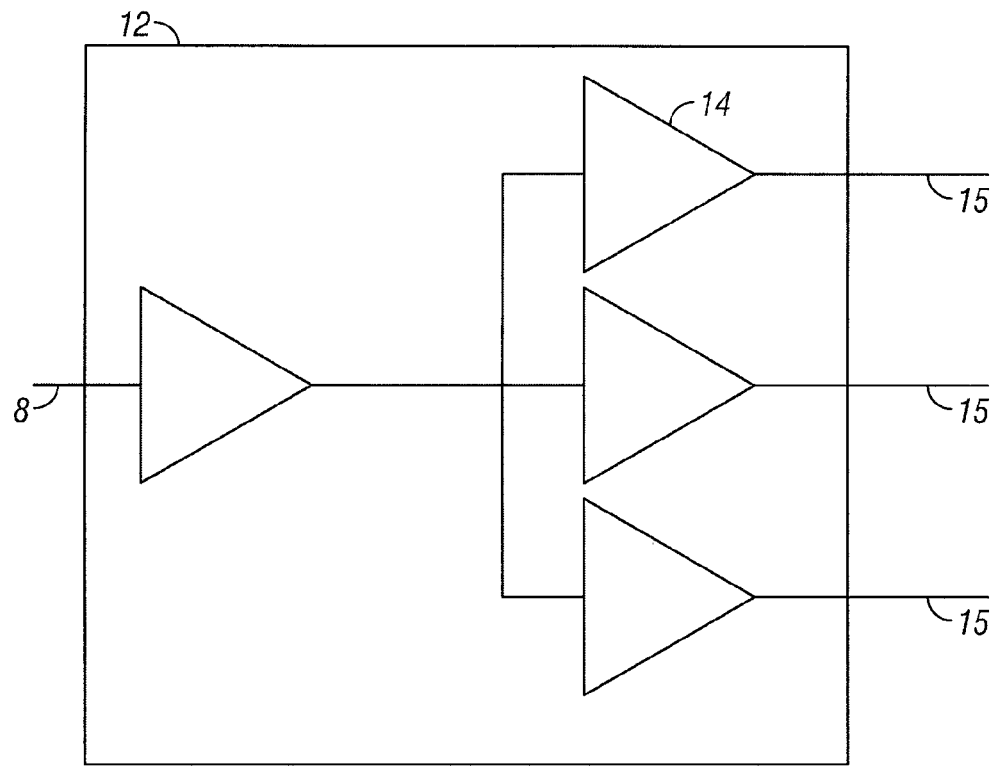
FIG. 3 illustrates an embodiment of the present invention with one or more stages, including one or more output stages, with each output stage produces multiple signal that are combined.

As illustrated in FIG. 3, the saturated power amplifier 12 has one or more stages, including one or more output stages 14. Each output stage 14 produces multiple signals 15 which are combined. The multiple signals can be combined by a variety of different mechanisms including but not limited to, the current domain, in a magnetic domain, with a balanced structure and the like.

Figure 4:
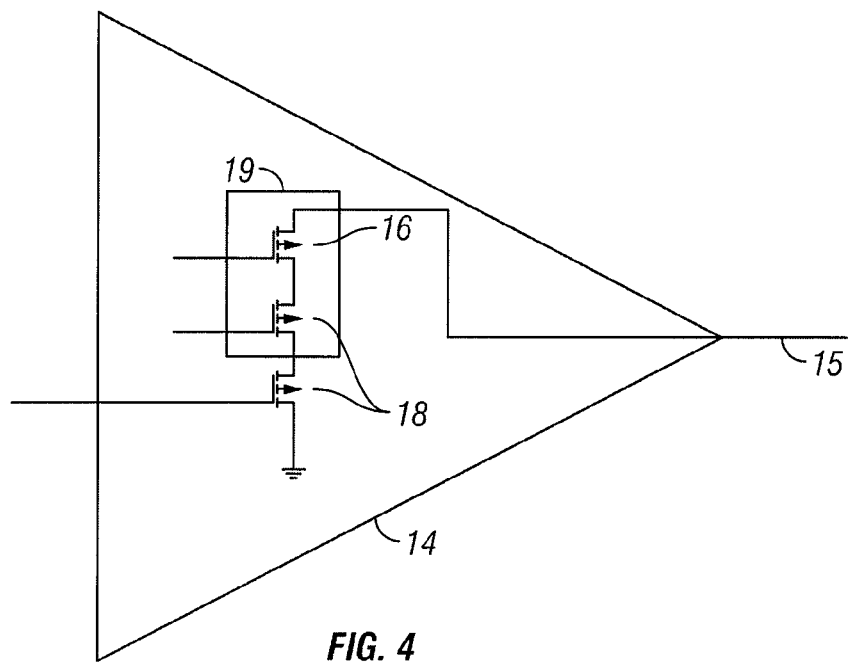
FIG. 4 illustrates an embodiment of the present invention with each output stage having one or more levels of cascoding, including one or more thick oxide devices and one or more thin oxide devices.

The saturated power amplifier system 10 provides selectable output power levels and exhibits, power efficiency over the desired range of power levels, high gain, high voltage swing and improved efficiency. Referring to FIG. 4, each output stage 14 has one or more levels of cascoding 19 including one or more thick oxide devices 16 and one or more thin oxide devices 18. The thin oxide device 18 can be a thin oxide driver device. A bias of cascode is increased when a high output voltage is detected. The thick and the thin oxide devices 16 and 18 can be MOS transistors.

A medium thick oxide device, with a thickness between that of the thick oxide device and the thin oxide device 18, can also be included. As a non-limiting example, the medium oxide device can be about 40-50 Å. By way of illustration, and without limitation, a thick oxide device can be about 80 and a thin oxide device can be about 20 Å. The advantage of a thick oxide device 16 is that the breakdown voltages are higher. As a non-limiting example, for a 3 volt nominal transistor, the breakdown voltages can be as high as 6 volts or more. For a thin oxide nominal 2 volt transistor, the breakdowns can be only up to 2.5 volts.

In one embodiment, with the power amplifier 12 of the present invention, the output needs to have a voltage swing that is as high as possible. As a non-limiting example, for a saturated power amplifier 12 the voltage swing could be 3 times that of the power supply, which is usually the battery voltage.

For a lithium ion battery the, voltage is about 3.5-3.7 volts and voltage swings can be up to 10.5 volts or more. The thick oxide device 16 needs to be biased in a manner that it never sees swings more than 6 volts across the nodes within the transistor, because this is the breakdown voltage of the transistor. In other words, the drain to the gate, the drain to source, and the gate to source voltages must never exceed 6 volts. This can be solved by having the top transistor be a thick oxide transistor 16 in order to avoid breakdowns. As a non-limiting example, if the gate is at 6 volts, the drain can have a voltage swing up to 12 volts and down to ground, with a potential voltage swing of 12 volts.

More than one thick oxide device 16 can be used. An advantage of using more than one thick oxide device 16 is an embodiment where the thin oxide device 18 can not tolerate much voltage swing, Two or more thick oxide devices 16 can be used, with one or more thin oxide devices 18, to make up for the non toleration of the thin oxide device 18.

They can have multiple oxide thicknesses, therefore use a thin on the bottom for the most gain, and then in the middle use a medium oxide to give more breakdown and also more gain than with a thick oxide device 16, and then on the top a thick oxide device 16 for tolerance of breakdown.

The thick oxide device 16 is positioned closer to the output than the thin oxide device 18. The thick oxide device 16 is configured to provide high voltage capability, and the thin oxide device 18 is configured to provide high gain at high frequency. The high voltage can be about twice that of the thin oxide device. The thin oxide gain is about 4 times that of the thick oxide device. Additionally, the thin oxide device 18 provides high gain and a large voltage swing from the thick oxide device 16. Therefore, the system 10 can achieve high gain and high voltage swing. A power supply 20 is coupled to the saturated power amplifier 12.

The bias on a thick transistor, under non-stress conditions, is substantially independent of the output. The bias of a thick transistor, under high stress conditions, moves to provide relief of stress of the power amplifier 12. The power amplifier 12 can provide a threshold at a certain stress. The threshold can be programmable. The bias on a thin cascode can be changed. When the bias goes high the efficiency is effected. The bias goes high under high stress conditions.

There can be three conditions for high stress. The present invention addresses each of these conditions for high stress. High stress can occur when the load has changed to a higher or lower impedance than the power amplifier 12 was originally designed for. The power amplifier 12 puts out less current but has more voltage swing, which can be on the order of 10 times or more greater than the nominal impedance of the power amplifier 12.

For high stress, there is voltage stress. For low impedance there is current stress.

In one embodiment, current and voltage waveforms of the power amplifier 12 line up in a manner and the result is snap back. With snap back a parasitic bipolar transistor, around the mosfet, turns on. With the present invention over-voltage protection circuits are needed to ensure that the parasitic bipolar transistor does not turn on.

At high power a condition can be created that pulls more current, and the voltage swing is much less. This is a high stress condition in that the transistors are running hot. In one embodiment of the present invention, the power amplifier 12 is designed for lower voltage swing in the nominal case and also detects when the current is too high.

The voltage swing can be too high, which can be detected, and the current can be too high, which can also be detected. In embodiments of the present invention, limiting circuits are provided, such as an over-voltage protection and an over-current protection circuit. This can be implemented when an overvoltage event is detected in which case the power amplifier 12 can be turned off. In another embodiment, the power is brought down so there is less of a voltage swing.

In another embodiment of the present invention, an over-voltage is detected and the baseband turns the power to the power amplifier 12 down. In another embodiment, a control is provided for tuning an antenna of a cell phone or other device. In this embodiment, the power amplifier 12 does the controlling or it sends a message to the baseband to control the tuning circuit.

In another embodiment of the present invention, high stress is dealt with by designing for a lower voltage swing in the nominal case than it is possible for the part to tolerate. This allows margin but provides a hit at nominal in efficiency.

Figure 5:
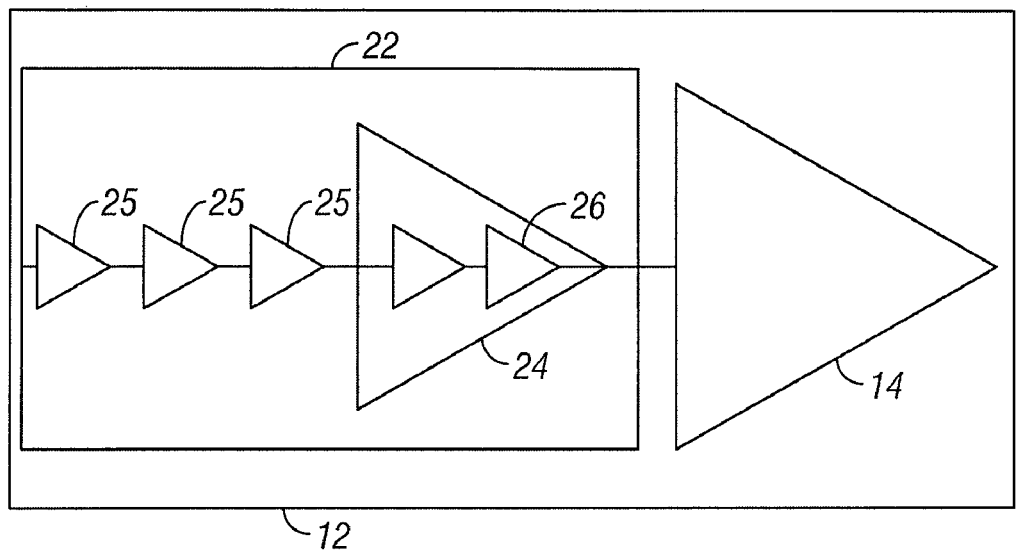
FIG. 5 illustrates an embodiment of the present invention where the saturated power amplifier has one or more driver stages.
Figure 6:
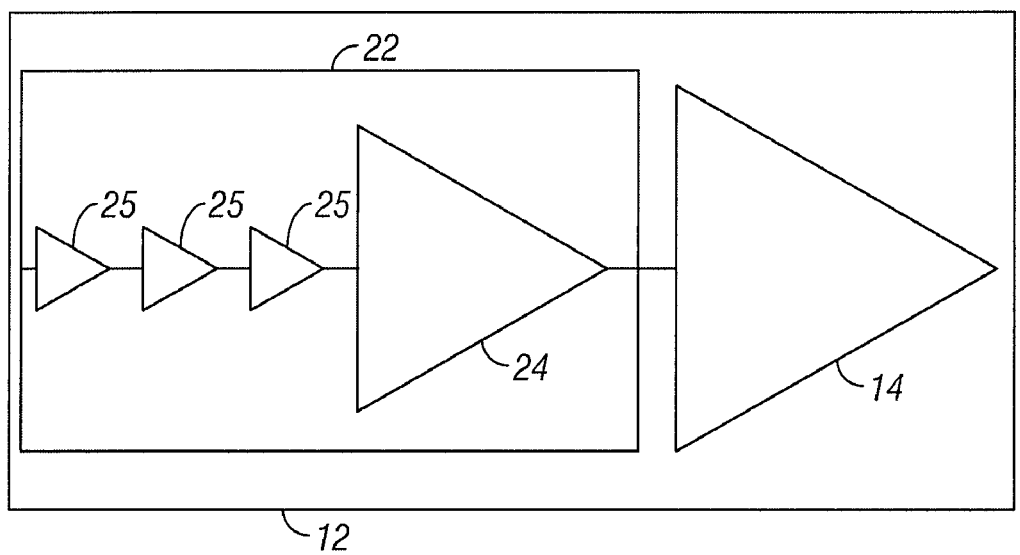
FIG. 6 illustrates an embodiment of the present invention with a driver amplifier that drives the output stage of the saturated power amplifier.

The saturated power amplifier 12 can have one or more driver stages, denoted as 22, shown in FIG. 5. Referring to FIG. 6, a driver amplifier 24 can be included that drives the output stage 14 of the saturated power amplifier 12. When driver stages 22 are included, one or more CMOS inverters 25 can be provided to drive the output stage 14. A chain of CMOS inverters 25, with gradually increasing size, can provide a switching function.

In one embodiment, a final stage 26 of the driver amplifier 24 is modulated to reduce power leaks from a driver stage 22. The supply to the output stage 14 can be modulated in order to add modulation information to the output signal.

The supply to one or more of the driver stages 22 can be modulated to provide a wider dynamic range for power control, which as non-limiting example can be at least 60 db for power amplifiers designed for the GSM cellphone system.

Figure 7:
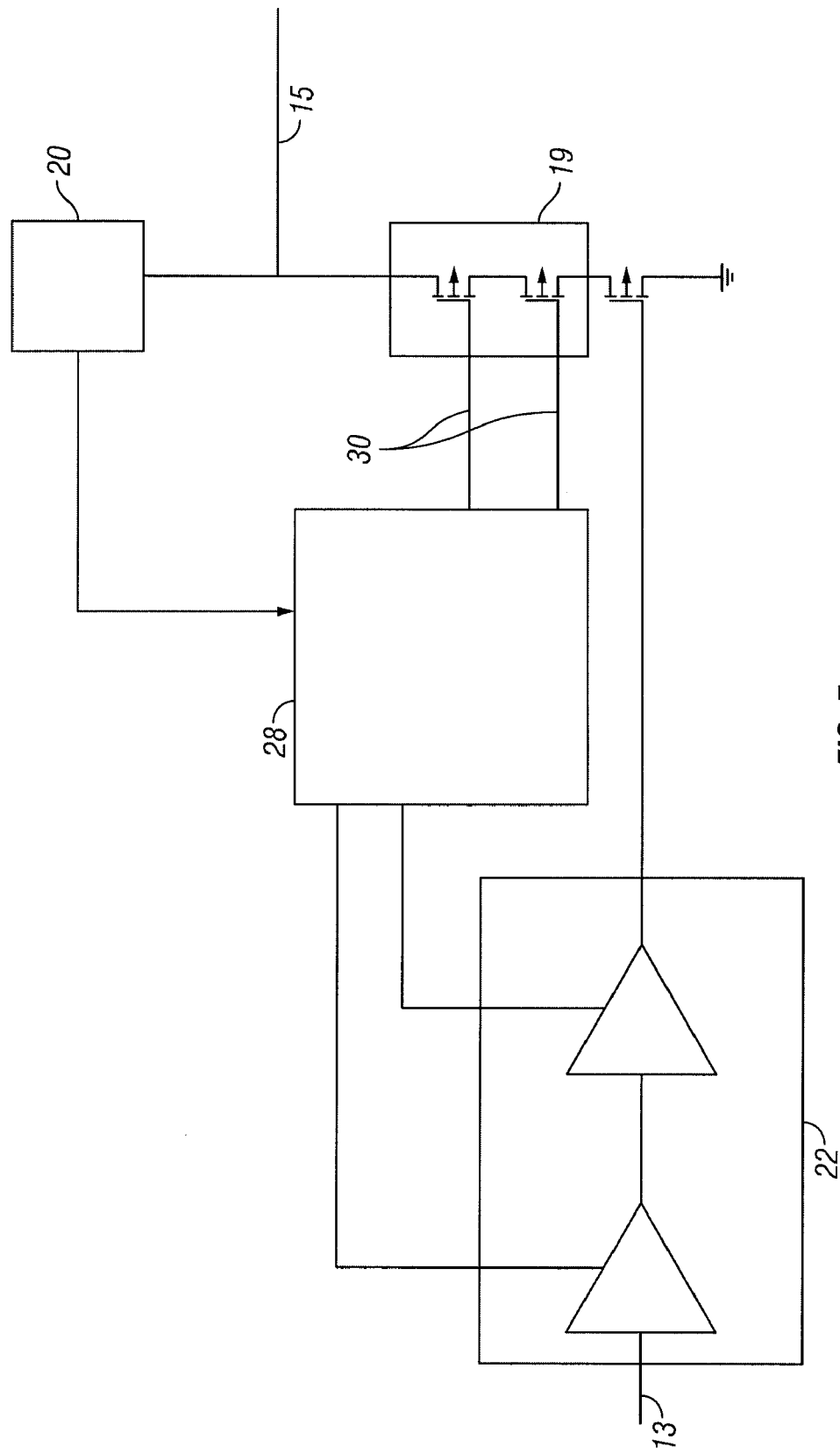
FIG. 7 illustrates an embodiment of the present invention with a modulator coupled to the saturated power amplifier with the modulator adding amplitude information to the input signal.

The input signal 13 to the saturated power amplifier 12 can contain phase information. As illustrated in FIG. 7, a modulator 28 can be provided and coupled to the saturated power amplifier 12. In this embodiment, the modulator 28 adds amplitude information to the input signal 13. The modulator 28 can be a polar transmitter.

In one embodiment, the power supply 20 for the saturated power amplifier 12 is modulated to add the amplitude information to the phase information of the input signal 13. The input signal 13 is pre-distorted. Fully Incorporated by reference is patent application Ser. No. 12/893,198, directed to systems and methods for adaptively optimizing power amplifier system linearity and other performance metrics, including but not limited to, power, efficiency, gain flatness, gain and the like, with variations in environmental conditions, such as VBAT, Process, Temperature, Frequency of operation, power input and the like. In one embodiment of the present invention, the cascode voltages are moved and the phase distortion characteristics are altered to provide for an improvement in linearity as discussed in the application Ser. No. 12/893,198. The power of the signal internal to the power amplifier 12 can be used to control the gate voltage for linearity and for breakdown reasons. This can be achieved with feed-back, feed-forward, and the like.

In one embodiment, the power amplifier 12 is used with a cellular phone such as a handset. GaAs is often used in handsets and is a high bandgap semiconductor that has high voltage breakdown performance with the same high gain at the frequency of interest. For example, breakdowns of 20 volts are typical. Often, GaAs transistors used in power amplifiers are single devices and don't require protection circuitry for voltage breakdown.

With the cascode architecture of the present invention, protection circuitry can be positioned around the power amplifier 12 when CMOS is used. With the present invention, the use of many cascodes can result in a linearization rise of the power amplifier 12, as well as allowing other trade offs such as efficiency, power, and the like.

Gates 30 of the cascode devices 19 and the supply to one or more of the driver stages 22 can be modulated to control the shape of and amount distortion (AM-AM and AM-PM). The input signal 13 can be pre-distorted for the purpose of correcting for non-linearity of system 10 and makes the pre-distortion characteristics easier.

In one embodiment, the thick oxide cascode transistors 16 act as switches. In this embodiment, the thick cascode transistors 16 steer current from one load to another load. This is achieved by using thick oxide devices 16 as switches. This is also useful for a multi mode device, for example, where the basic core is the same, but the loads are different to support operation such as a GSM amplifier, a WCDMA amplifier, and the like. This can also be used in a dual band amplifier to steer current between a low band load and a high band load.

Figure 8:
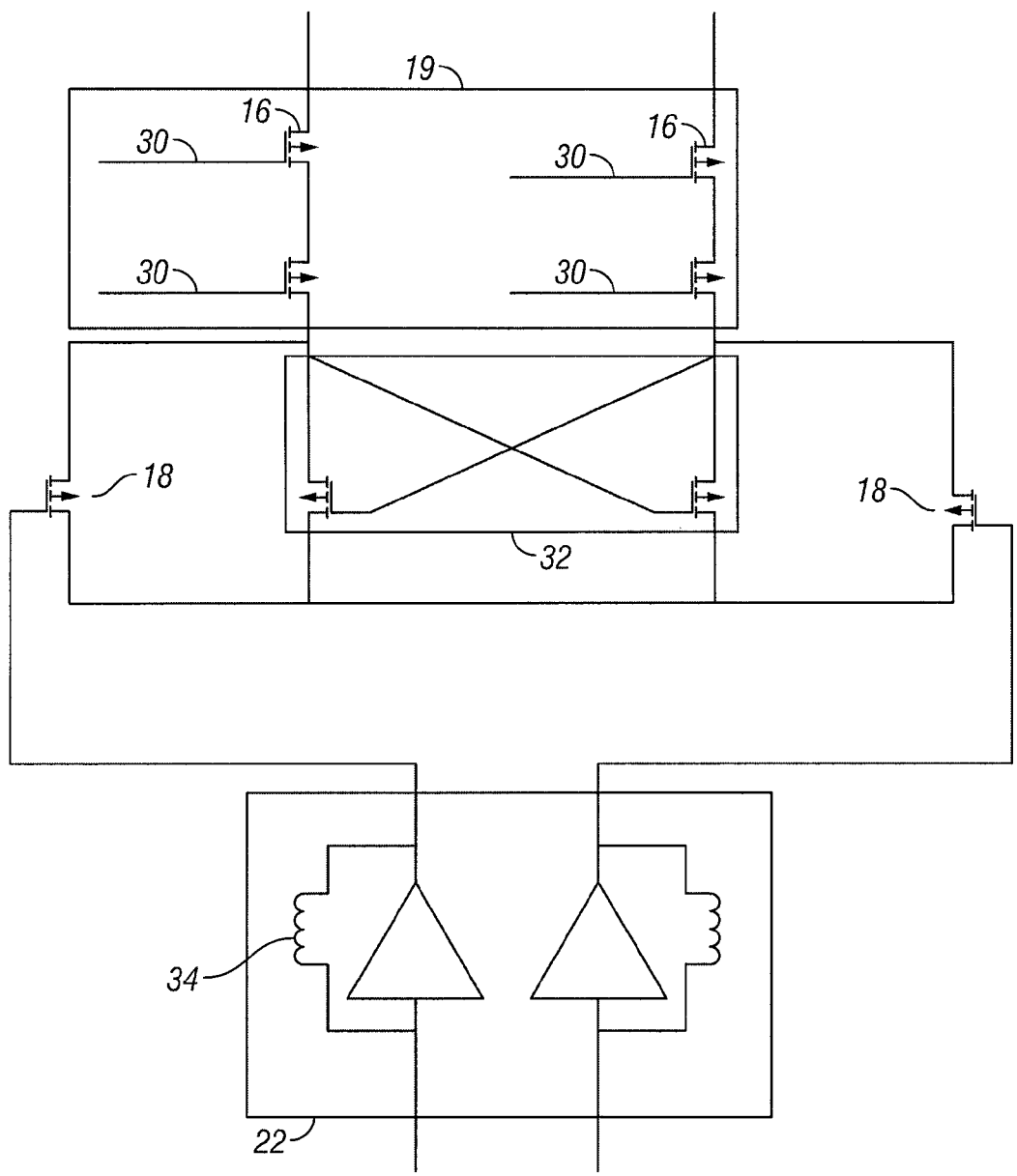
FIG. 8 illustrates an embodiment of the present invention with a source for positive feedback coupled to one or more stages of the saturated power amplifier.

Referring to FIG. 8, a source for positive feedback 32 can be coupled to one or more stages of the saturated power amplifier 12. In one specific embodiment, the positive feedback 32 is provided to the output stage 14. The sources of the positive feedback can be cross-coupled transistors, cross-coupling of transistors through capacitors, and the like In one embodiment, one or more stages of the saturated power amplifier 12 use one or more of the inductors 34 and positive feedback 32.

In one embodiment, positive feedback is provided to at least one stage of the power amplifier 24 to square the wave up, introduce a tank circuit and provide an oscillator that can be locked to the RF input signal 13.

In one embodiment, the saturated power amplifier 12 includes a plurality of output stages 14 and driver stages 22, and a plurality of cascoding devices 19.

In one embodiment, a plurality of thick and thin oxide cascode transistors 16 and 18 are provided to provide for high gain and high output swing which provides power added efficiency (PAE).

Expected variations or differences in the results are contemplated in accordance with the objects and practices of the present invention. It is intended, therefore, that the invention be defined by the scope of the claims which follow and that such claims be interpreted as broadly as is reasonable.

What is claimed is:

1. A saturated power amplifier system, comprising:
   a saturated power amplifier that receives an input signal, the saturated power amplifier having one or more stages including one or more output stages, each of an output stage producing multiple signals which are combined, the output stage having one or more levels of cascoding, the cascoding including one or more thick oxide devices and one or more thin oxide devices, wherein a bias of cascoding devices is increased when a high output voltage is detected;

a power supply coupled to the saturated power amplifier; and a source of positive feedback that is coupled to the one or more stages of the saturated power amplifier.

2. The system of claim 1, wherein bias on a thick transistor under non-stress conditions is substantially independent of the output, and bias under high stress conditions moves to provide relief of a stress of the saturated power amplifier system.

3. The system of claim 1, wherein the system provides a threshold at a certain threshold of stress.

4. The system of claim 3, wherein the threshold is programmable.

5. The system of claim 1, wherein bias on a thin cascode is changed.

6. The system of claim 1, wherein a plurality of thick and thin oxide cascode transistors and are provided to provide for high gain and high output swing which provides power added efficiency (PAE).

7. The system of claim 1, further comprising:
one or more driver stages.

8. The system of claim 7, wherein gates of the cascode devices and the supply to the driver stage are modulated to control the shape of and amount distortion (AM-AM and AM-PM).

9. The system of claim 8, wherein the input signal is pre-distorted.

10. The system of claim 7, wherein the positive feedback is provided to at least one stage of the power amplifier to square the signals up.

11. The system of claim 7, wherein a final stage of the driver amplifier is modulated to reduce power leaks from the driver stage.

12. The system of claim 1, wherein the thin oxide device is a thin oxide driver device.

13. The system of claim 1, further comprising:
a driver amplifier that drives the output stage of the power amplifier.

14. The system of claim 1, wherein the saturated power amplifier includes a plurality of output stages.

15. The system of claim 1, wherein the saturated power amplifier includes a plurality of driver stages.

16. The system of claim 15, further comprising:
one or more CMOS inverters that drive the output stage.

17. The system of claim 1, wherein the saturated power amplifier includes a plurality of cascoding devices.

18. The system of claim 1, wherein the thick oxide device is positioned closer to the output than the thin oxide device.

19. The system of claim 1, wherein the thick oxide device is configured to provide high voltage capability, and the thin oxide device is configured to provide high gain at high frequency.

20. The system of claim 1, wherein the multiple signals are combined by through at least one of, the current domain, in a magnetic domain and with a balanced structure.

21. The system of claim 1, wherein the thick oxide device is a MOS transistor and the thin oxide drive device is a MOS transistor.

22. The system of claim 1, wherein the saturated power amplifier is a CMOS power amplifier.

23. The system of claim 1, wherein the saturated power amplifier is a differential power amplifier.

24. The system of claim 1, wherein the saturated power amplifier is a balanced power amplifier.

25. The system of claim 1, wherein the thin oxide device provides high gain and the thin oxide driver device provide a large voltage swing from the thick oxide device.

26. The system of claim 1, the source of the positive feedback is selected from one or more of, cross-coupled transistors and cross-coupling of transistors through capacitors.

27. The system of claim 1, wherein the positive feedback is provided to the output stage.

28. The system of claim 27, further comprising:
a chain of CMOS inverters with gradually increasing size that provide a switching function.

29. The system of claim 1, further comprising:
one or more inductors in one or more of the stages to resonate out a parasitic capacitance.

30. The system of claim 1, wherein one or more stages of the saturated power amplifier use one or more of the inductors and positive feedback.

31. The system of claim 1, wherein the supply to the output stage is configured to be modulated to add modulation information to the output signal.

32. The system of claim 1, wherein the supply to one or more of the drive stages is modulated to provide a wider dynamic range for power control.

33. The system of claim 1, wherein gates of the cascode devices and the supply to the output stage are modulated to control the shape of and amount distortion (AM-AM and Am-PM).

34. The system of claim 1, further comprising:
a plurality of thick oxide cascode transistors; and
a plurality of thin oxide driver transistors.

35. The system of claim 34, where the thick oxide cascode transistors act as switches.

36. The system of claim 35 wherein the thick oxide transistors switch between different load impedances.

37. The system of claim 36, wherein the power amplifier is a multi-mode part and the load impedances are load impedances for different cellular systems.

38. The system of claim 36, wherein the power amplifier is a dual band part and the load impedances are load impedances for high band and low band.

39. The system of claim 1, wherein the input signal to the saturated power amplifier contains phase information.

40. The system of claim 39, further comprising:
a modulator coupled to the saturated power amplifier, the modulator adding amplitude information to the input signal.

41. The system of claim 40, wherein the modulator is a polar transmitter.

42. The system of claim 40, wherein the supply for the saturated power amplifier is modulated to add the amplitude information to the phase information of the input signal.

43. The system of claim 40, wherein the input signal is pre-distorted.

44. A saturated power amplifier system, comprising:
a saturated power amplifier that receives an input signal, the saturated power amplifier having one or more stages including one or more output stages, each of an output stage producing multiple signals which are combined, the output stage having one or more levels of cascoding, the cascoding including one or more thick oxide devices and one or more thin oxide devices;
a power supply coupled to the saturated power amplifier; and
a source of positive feedback that is coupled to the one or more stages of the saturated power amplifier.

* * * * *